United States Patent [19]
Shiino et al.

[11] Patent Number: 5,946,607
[45] Date of Patent: Aug. 31, 1999

[54] METHOD OF APPARATUS FOR AUTOMATIC GAIN CONTROL, AND DIGITAL RECEIVER USING SAME

[75] Inventors: Haruhiro Shiino; Norio Yamaguchi; Toshimichi Naoi, all of Tokyo, Japan

[73] Assignee: Oki Electric Industry Co., Ltd., Tokyo, Japan

[21] Appl. No.: 08/828,714

[22] Filed: Mar. 28, 1997

[30] Foreign Application Priority Data

May 24, 1996 [JP] Japan ................................. 8-130264

[51] Int. Cl.⁶ .................................................. H04B 1/06
[52] U.S. Cl. ................................................... 455/234.1
[58] Field of Search ............................. 455/234.1, 219, 455/232.1, 250.1, 194.1, 234.2, 247.1, 246.1; 375/345

[56] References Cited

U.S. PATENT DOCUMENTS

| | | |
|---|---|---|
| 5,396,520 | 3/1995 | Degges ..................................... 375/316 |
| 5,422,909 | 6/1995 | Love et al. ............................... 375/200 |
| 5,469,115 | 11/1995 | Peterzell et al. ......................... 330/129 |
| 5,565,932 | 10/1996 | Citta et al. ............................... 348/678 |
| 5,603,113 | 2/1997 | De Loe, Jr. ............................. 455/234.1 |
| 5,673,293 | 9/1997 | Scarpa et al. ............................ 375/321 |
| 5,699,011 | 12/1997 | Sgrignoli ................................. 329/350 |
| 5,758,271 | 5/1998 | Rich et al. ............................. 455/234.1 |
| 5,758,274 | 5/1998 | Vu et al. ............................... 455/246.1 |
| 5,761,251 | 6/1998 | Wender .................................... 375/345 |
| 5,812,025 | 9/1998 | Shimazaki ............................... 330/129 |

*Primary Examiner*—Nguyen Vo
*Assistant Examiner*—Charles N. Appiah
*Attorney, Agent, or Firm*—Venable; Robert J. Frank; Allen Wood

[57] ABSTRACT

An analog input signal is fed to an amplifier having a gain level that is determined by a gain control signal, and the amplified input signal is then converted into a digital received signal. A direct-current offset is detected from the digital received signal. The gain control signal is generated based in part on the direct-current offset.

8 Claims, 6 Drawing Sheets

METHOD OF APPARATUS FOR AUTOMATIC GAIN CONTROL, AND DIGITAL RECEIVER USING SAME

CROSS REFERENCE TO RELATED APPLICATION

This application claims the priority of Application No. H8-130264, filed May 24, 1996 in Japan, the subject matter of which is incorporated herein by reference.

TECHNICAL FIELD OF THE INVENTION

The present invention relates to a digital receiver utilized for mobile communication, and more particularly to, an automatic gain control apparatus used in such a digital receiver.

BACKGROUND OF THE INVENTION

Recently, digital receivers, such as mobile telephone sets, are becoming increasingly popular in the mobile communication field. In such a digital receiver, the average power of received signals usually has a D-range (Dynamic-range) which is higher than 70 dB. Temporarily, the received signals are undesirably changed in level by fading. For stable communication, it is important to control the level of the received signals, and therefore, most digital receivers are provided with automatic gain control apparatuses to maintain the received signal at an optimum level.

A conventional automatic gain control apparatus includes a gain-controllable amplifier, which amplifies an analog input signal at a gain level determined in accordance with a gain control signal. The gain-controllable amplifier is connected at an output terminal to an A/D (Analog-to-Digital) converter, which converts the amplified analog signal into a digital signal. The digital signal is supplied to a demodulation circuit, which recovers the data from the digital signal. The gain control signal is generated based on the difference between the average power of the digital signal and a reference value, which is nominally determined in advance. In general, the reference value is determined to have a favorable level so that the analog signal entered into the A/D converter has a maximum amplitude which corresponds to the maximum permissible level of the A/D converter. To determine the reference value in such a manner allows the A/D converter to have an optimum S/N (Signal to Noise) ratio and to output a good shape of digital signal. Namely, the levels of the reference value and the gain control signal are determined so as to obtain a high S/N ratio and a good shape of digital signal, from which modulated data may be demodulated accurately.

According to the earlier described conventional automatic gain control apparatus, however, there is a disadvantage in that the amplitude of the analog input signal is not always controlled at a favorable gain level because of a direct-current offset. In more detail, a direct-current offset may undesirably be added to the analog input signal at the gain-controllable amplifier or the A/D converter. When the direct-current offset is added to the analog input signal, the signal may have a maximum amplitude which is over the maximum permissible level of the A/D converter. If the A/D converter is supplied with an over level of input signal, the digital output signal has a distorted waveform. Such a distorted wave form of digital signal disturbs accurate demodulation in the demodulation circuit. For producing a good shape of digital signal, if the direct-current offset is nominally taken away from the reference value, the maximum amplitude of the analog input signal may become much lower than the maximum permissible level of the A/D converter, and therefore, the S/N ratio gets worse.

OBJECTS OF THE INVENTION

Accordingly, an object of the invention is to provide a method for automatic gain control in which the amplitude of an input signal is controlled at an optimum gain level.

It is another object of the invention to provide an automatic gain control apparatus in which the amplitude of an input signal is controlled at an optimum gain level.

It is still another object of the invention to provide a digital receiver utilizing an automatic gain control apparatus by which the amplitude of an input signal is controlled at an optimum gain level, so that accurate demodulation can be carried out while minimizing the reduction of the S/N ratio.

SUMMARY OF THE INVENTION

According to the invention, the amplitude of an analog input signal is controlled at an optimum gain level determined by a gain control signal, and is converted into a digital received signal. A direct-current offset is detected from the digital received signal. The level of the gain control signal is determined in consideration of the direct-current offset.

In this invention, preferably, a reference value is generated in consideration of the direct-current offset. The reference value corresponds to a desired average level of the digital received signal. The average level of the digital received signal is compared to the reference value to provide the difference value between them. Based on the difference value, the gain control signal is generated to have a favorable level so as to approximate the average level of the digital received signal to the reference value.

As mentioned above, according to the invention, the reference value is determined in consideration of the direct-current offset, so that the amplitude of the analog received signal can be controlled favorably at all times. As a result, the S/N ratio of the digital received signal can be maintained high. At the same time, a good shape of digital received signal may be provided, so that modulated data can be accurately demodulated from the digital received signal.

Additional objects, advantages and novel features of the invention will be set forth in the following description, and will become apparent to those skilled in the art upon examination. Further, the objects and advantages of the invention may be realized and attained by means of the instrumentalities and combinations particularly pointed out in the appended claims.

DESCRIPTION OF THE PREFERRED EMBODIMENTS

Figure 1:
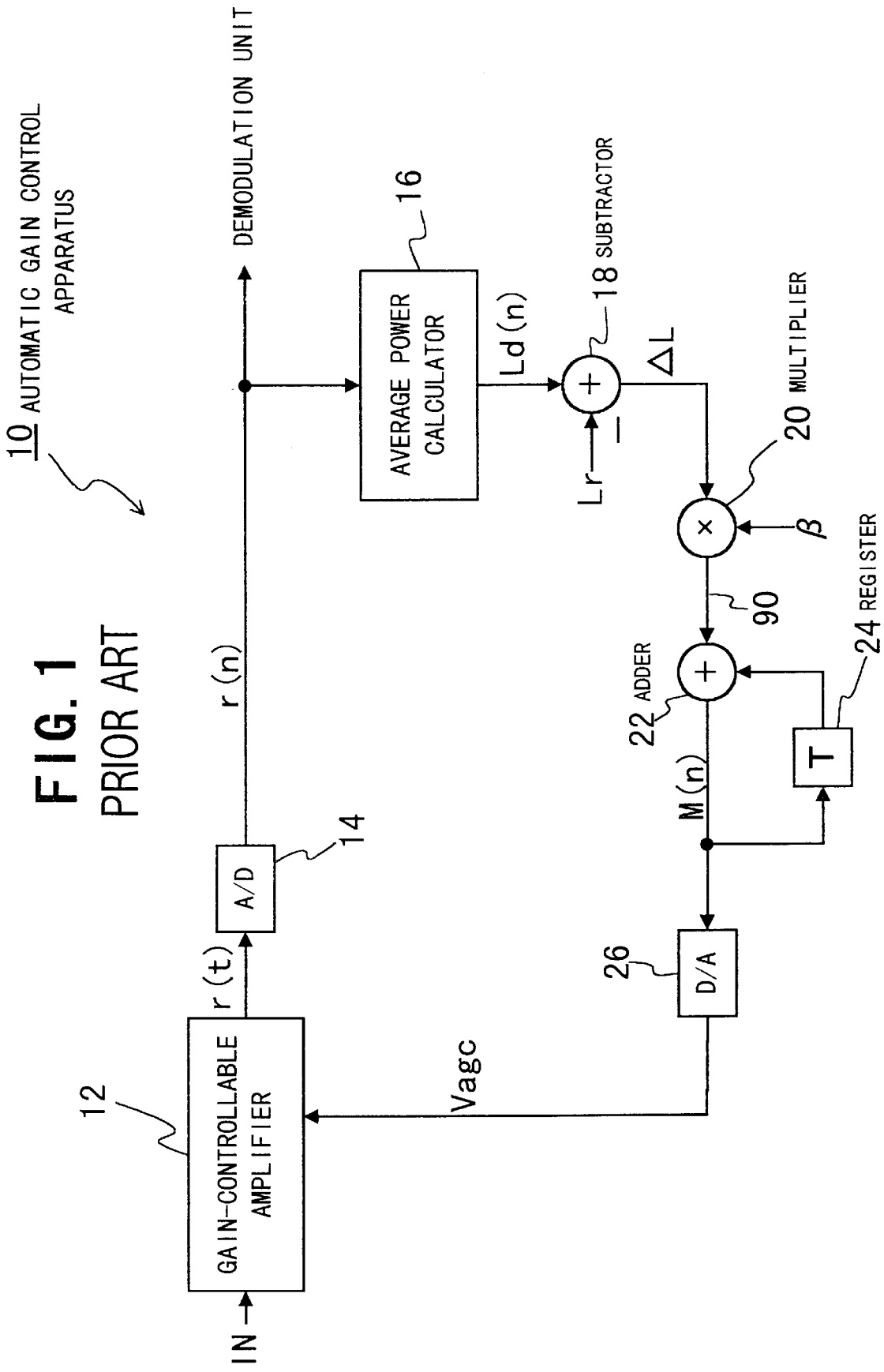
FIG. 1 is a block diagram showing a conventional automatic gain control apparatus.

For better understanding of the invention, a conventional automatic gain control apparatus 10 will be first described. FIG. 1 shows the conventional automatic gain control apparatus 10, utilized in a digital receiver, for controlling the level of a received signal. The automatic gain control apparatus 10 includes a gain-controllable amplifier 12 which amplifies or attenuates the amplitude of an analog input signal IN to provide an analog received signal r(t). The gain-controllable amplifier 12 is connected at an output terminal to an A/D (Analog-to-Digital) converter 14, which converts the analog received signal r(t) into a digital received signal r(n). The A/D converter 14 is connected at an output terminal to a demodulation unit (not shown) and an average power calculator 16, which calculate the average power Ld(n) of the digital received signal r(n). The average power calculator 16 is connected at an output terminal to a subtractor 18, which subtracts a reference power Lr from the average power Ld(n) to provide a difference power ΔL. The subtractor 18 is connected at an output terminal to a multiplier 20, which multiplies the difference power ΔL by a constant β to provide a signal 90. The multiplier 20 is connected at an output terminal to an integrator, which is composed of an adder 22 and a register 24. The adder 22 is connected at an output terminal to a D/A (Digital-to-Analog) converter 26. The D/A converter 26 supplies a gain control signal Vagc, which is a voltage signal, to the gain-controllable amplifier 12.

When the analog input signal IN is supplied to the gain-controllable amplifier 12, the signal IN is amplified at a gain level determined in accordance with the gain control signal Vagc to provide the analog received signal r(t). The A/D converter 14 samples the analog received signal r(t) at predetermined intervals to provide the digital received signal r(n), from which the modulated data is demodulated. In the symbol r(n), "n" indicates a sampling time thereof. The digital received signal r(n) is supplied to the demodulation unit and to the average power calculator 16. The average power calculator 16 performs a calculation to provide the average power Ld(n) of the digital received signal r(n). The subtractor 18 compares the average power Ld(n) with the reference power Lr, which is nominally determined in advance, to provide the difference power ΔL between them. The difference power ΔL can be called an error power. The integrator, composed of the adder 22 and the register 24, performs integration of the signal 90 to provide a signal M(n) to be supplied one by one to the D/A converter 26. The D/A converter 26 generates the gain control signal Vagc in accordance with the signal M(n). The gain control signal Vagc is supplied to a control terminal of the gain-controllable amplifier 12.

In the automatic gain control apparatus 10, each component operates favorably in order that the digital received signal r(n) has an appropriate power. In addition, the reference power Lr is determined favorably so that the analog received signal r(t) has a maximum amplitude which corresponds to the maximum permissible level of the A/D converter 14. That process allows the A/D converter 14 to have the optimum S/N ratio (Signal-to-Noise ratio). In digital mobile communication, the reference power Lr is generally determined as follows:

If the apparatus is affected by Rayleigh-fading, the input signal IN theoretically has a maximum amplitude which is not four times as large as the average amplitude thereof. Thus, the reference power Lr is generated to have a desirable level so that the average level of the analog received signal r(t) becomes one fourth of the maximum permissible level of the A/D converter 14.

According to the conventional automatic gain control apparatus 10, however, there is a disadvantage in that a direct-current offset is undesirably added to the analog received signal r(t) at the gain-controllable amplifier 12 and/or the A/D converter 14. Thus, the analog received signal r(t) may have a maximum amplitude which is over the maximum permissible level of the A/D converter 14. The digital received signal r(n), therefore, has a distorted waveform, and accurate demodulation may not be performed. In contrast, if the direct-current offset is nominally taken away from the reference power Lr, there is another problem in that the S/N ratio becomes worse.

Figure 2:
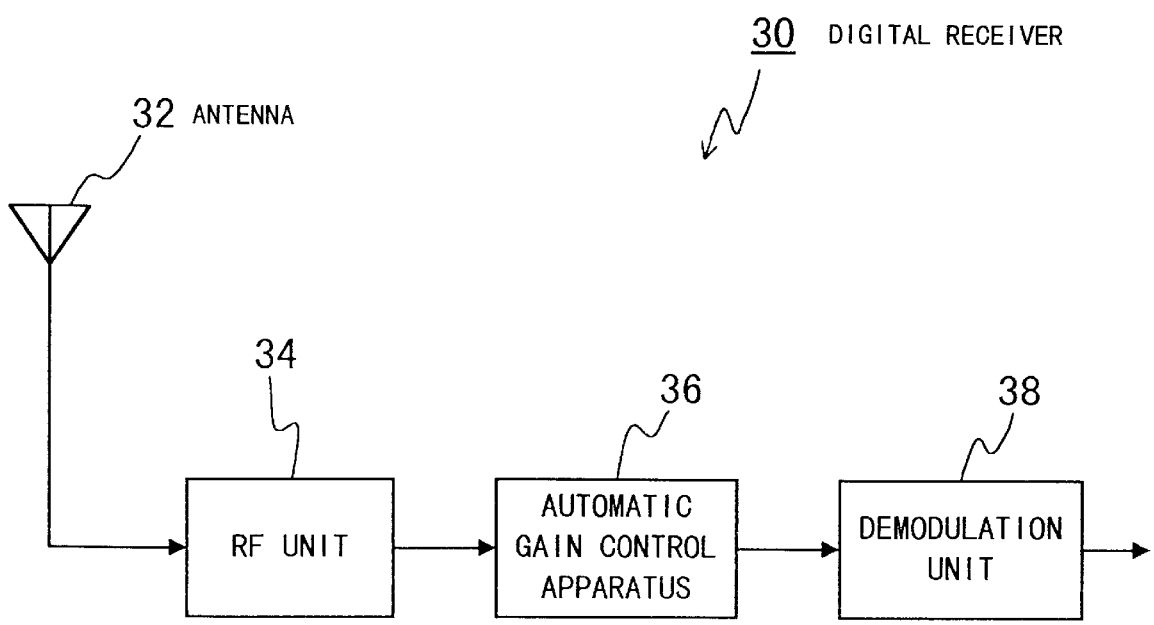
FIG. 2 is a block diagram showing a digital receiver according to a preferred embodiment of the invention.

FIG. 2 shows a digital receiver 30 according to the invention. The digital receiver 30 is such as a cellular type of telephone set, which is utilized for mobile communication. The digital receiver 30 includes an antenna 32 for receiving an electromagnetic signal transmitted from a transmitter (not shown). The antenna 32 is connected to an RF unit 34, which converts an RF signal (Radio-Frequency signal) into an IF (Intermediate Frequency) signal or a base-band signal. The RF unit 34 may includes various components, such as a low-noise amplifier, a filter, a mixer and a local oscillator. The RF unit 34 is connected at an output terminal to an input terminal of an automatic gain control apparatus 36, which amplifies the IF signal or the base-band signal at a favorable gain level. The automatic gain control apparatus 36 is connected at an output terminal to an input terminal of a demodulation unit 38, which recovers modulated data from the output signal of the automatic gain control apparatus 36. The demodulation unit 38 may includes various components, such as a detector, a carrier recovery circuit, and a timing recovery circuit.

Figure 3:
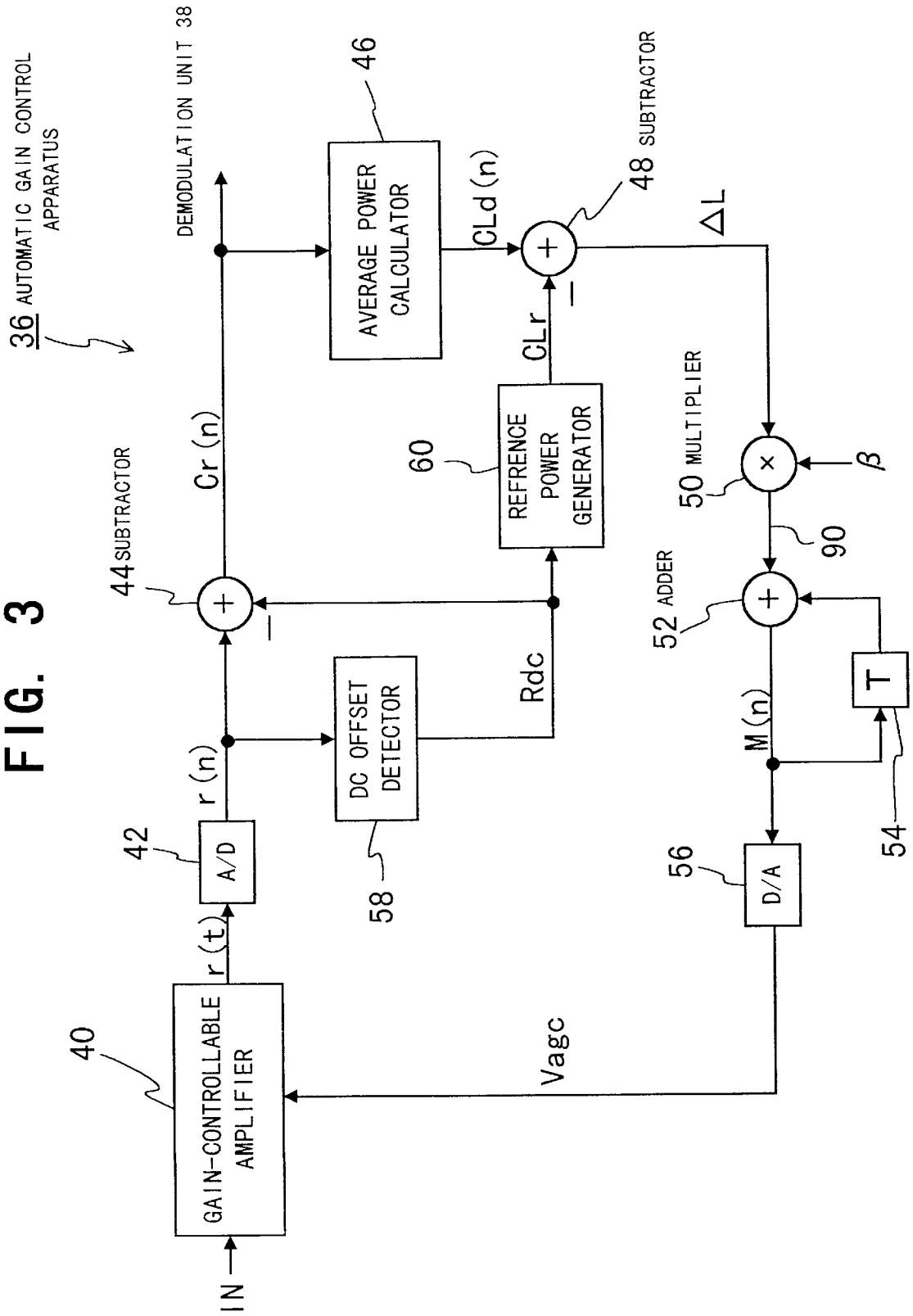
FIG. 3 is a block diagram showing an automatic gain control apparatus according to the preferred embodiment of the invention.

FIG. 3 shows the automatic gain control apparatus 36, which includes a gain-controllable amplifier 40 which amplifies or attenuates an analog input signal IN at a gain level determined in accordance with a gain control signal Vagc. The gain-controllable amplifier 40 is connected at an output terminal to an A/D (Analog-to-Digital) converter 42, which converts the amplified/attenuated analog signal into a digital received signal r(n).

The A/D converter 12 is connected at an output terminal to a DC offset detector 58 and to a subtractor 44. The output signal of the DC offset detector 58 is supplied to the subtractor 44 and to a reference power generator 60. The DC offset detector 58 detects a direct-current offset Rdc from the digital signal r(n), supplied from the A/D converter 42. The reference power generator 60 generates a reference power CLr in consideration of the direct-current offset Rdc. Namely, the reference power CLr is generated by a combination of the DC offset detector 58 and the reference power generator 60.

The subtractor 44 subtracts the direct-current offset Rdc from the digital received signal r(n) to provide a corrected received signal Cr(n), which is to be supplied to the demodulation unit 38 and an average power calculator 46. The average power calculator 46 calculates the average power CLd(n) of the corrected received signal Cr(n), of which detailed operation will be described later.

A subtractor 48 is connected at input terminals to the average power calculator 46 and the reference power generator 60 to receive the reference power CLr and the average power CLd(n), is respectively. The subtractor 48 is connected at an output terminal to a multiplier 50, which multiplies the output signal ΔL of the subtractor 48 by a constant β to provide a signal 90. The multiplier 50 is connected at an output terminal to an integrator, which is composed of an adder 52 and a register 54. An output signal M(n) of the integrator (52 and 54) is supplied to a D/A (Digital-to-Analog) converter 56. The gain control signal Vagc is produced by a combination of the subtractor 48, the multiplier 50, the adder 52, the register 54 and the D/A converter 56. The gain control signal Vagc of an appropriate voltage is supplied to the gain-controllable amplifier 40 so that the average power CLd(n) of the corrected received signal Cr(n) approximates to the reference power CLr.

Figure 4:
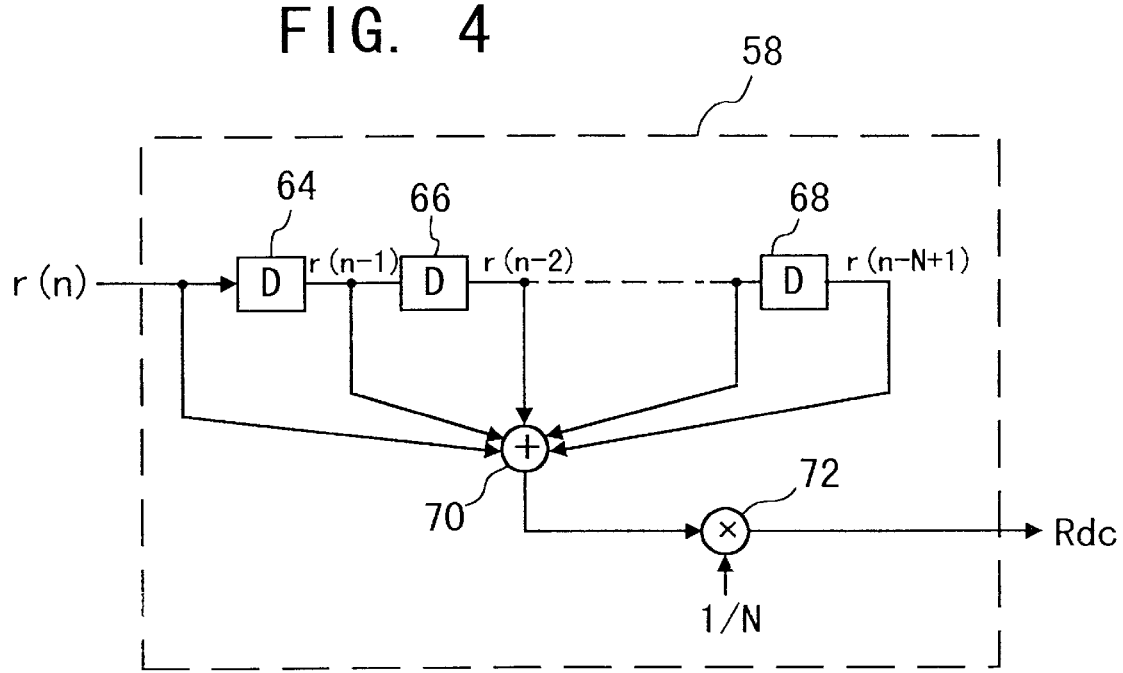
FIG. 4 is an explanatory view showing the circuitry of a DC offset detector utilized in the automatic gain control apparatus according to the preferred embodiment of the invention.

FIG. 4 shows the circuitry of the DC offset detector 58, which includes first to (N-1)th delay circuits 64,66, . . . ,68. The delay circuits 64,66, . . . ,68 may be D flip-flops, each of whose output is a function of the input which appeared one pulse earlier. The DC offset detector 58 also includes an adder 70 which combines digital received signals r(n) to r(n-N+1) to give an output signal having a level that is proportional to the sum of the levels of the digital received signals r(n) to r(n-N+1). The adder 70 is connected at an output terminal to an multiplier 72 which multiplies the sum of the digital received signals r(n) to r(n-N+1) by 1/N to provide the direct-current offset Rdc. Consequently, the DC offset detector 58 is designed to carry out the following equation:

$$Rdc = \frac{1}{N} \sum_{i=0}^{N-1} r(n-i)$$

Figure 5:
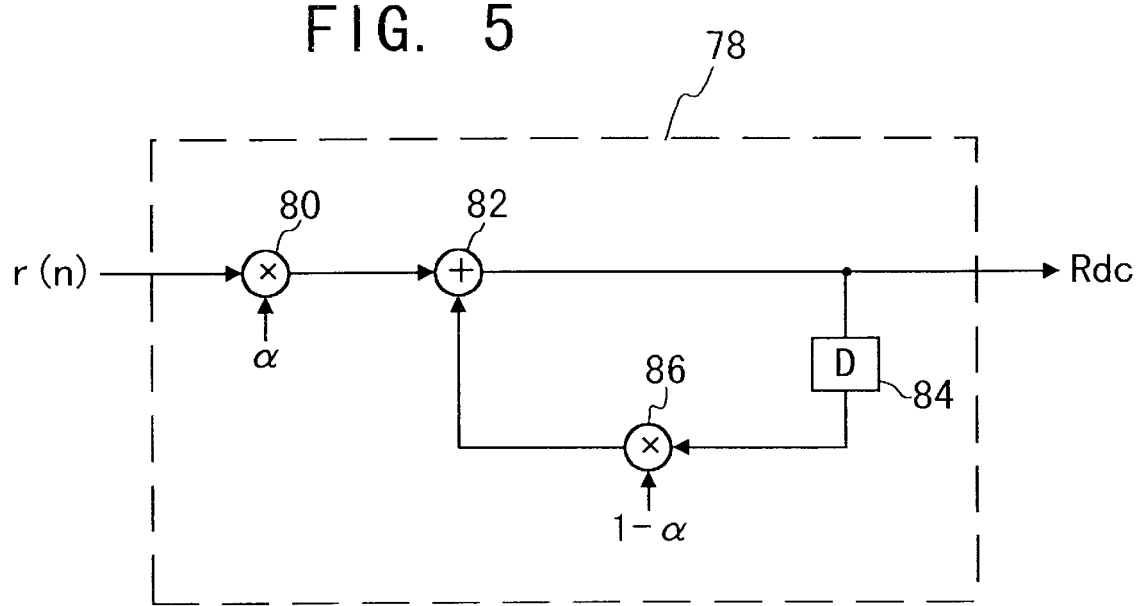
FIG. 5 is an explanatory view showing the circuitry of another type of DC offset detector which is applicable to the automatic gain control apparatus of the invention.

FIG. 5 shows another type of DC offset detector 78, which is applicable to the automatic gain control apparatus 36 instead of the DC offset detector 58. The DC offset detector 78 includes a multiplier 80 which multiplies the digital received signal r(n) by a constant α. The multiplier 80 is connected at an output terminal to an adder 82 whose output signal becomes the direct-current offset Rdc. The direct-current offset Rdc is supplied to a delay circuit 84, such as a D flip-flop, which is connected at an output terminal to a multiplier 86. The multiplier 86 multiplies the output signal of the delay circuit 84 by (1-α). The multiplier 86 is connected at an output terminal to the adder 82, so that the adder 82 combines the output signal of the multiplier 86 to the output signal of the multiplier 80. Consequently, the DC offset detector 78 is designed to carry out the following equation:

$$Rdc = (1-\alpha)Rdc + \alpha r(n)$$

Now, operation of the automatic gain control apparatus 36 will be described. When the analog input signal IN is supplied from the RF unit 34, the signal IN is amplified or attenuated by the gain-controllable amplifier 40 at a gain level determined in accordance with the gain control signal (voltage) Vagc to provide the analog received signal r(t). The analog received signals r(t) are sampled at predetermined intervals by the A/D converter 42 to convert them into the digital received signals r(n), which are to be supplied to the DC offset detector 58 and the subtractor 44. In the reference symbol r(n), "n" indicates a sampling time thereof.

The average level of the digital received signal r(n) is calculated by the DC offset detector 58 for many hours to provide the direct-current offset Rdc in order. The direct-current offset Rdc is subtracted from the digital received signal r(n) by the subtractor 44 to provide the corrected received signal Cr(n). The corrected received signal Cr(n) is supplied to the demodulation unit 38 and the average power calculator 46. The average power calculator calculates the average power CLd(n) of the corrected received signal Cr(n).

In accordance with the direct-current offset Rdc, which is supplied from the DC offset detector 58, the reference power generator 60 corrects a nominally-determined reference power Lr so as to provide the reference power CLr. The subtractor 48 finds the different power ΔL between the average power CLd(n) and the reference power CLr.

In other words, the subtractor 48 subtracts the average power CLd(n) from the reference power CLr to provide the difference power ΔL, which can be called an error power. The integrator, composed of the adder 52 and the register 54, performs integration of the signal 90 to provide the signal M(n) to be supplied one by one to the D/A converter 56. The D/A converter 26 performs voltage conversion to the signal M(n) to provide the gain control signal Vagc. The gain control signal Vagc is supplied to a control terminal of the gain-controllable amplifier 40. Thus, the automatic gain control apparatus 36 operates to maintain the power of the corrected received signal Cr(n) constant.

Figure 7:
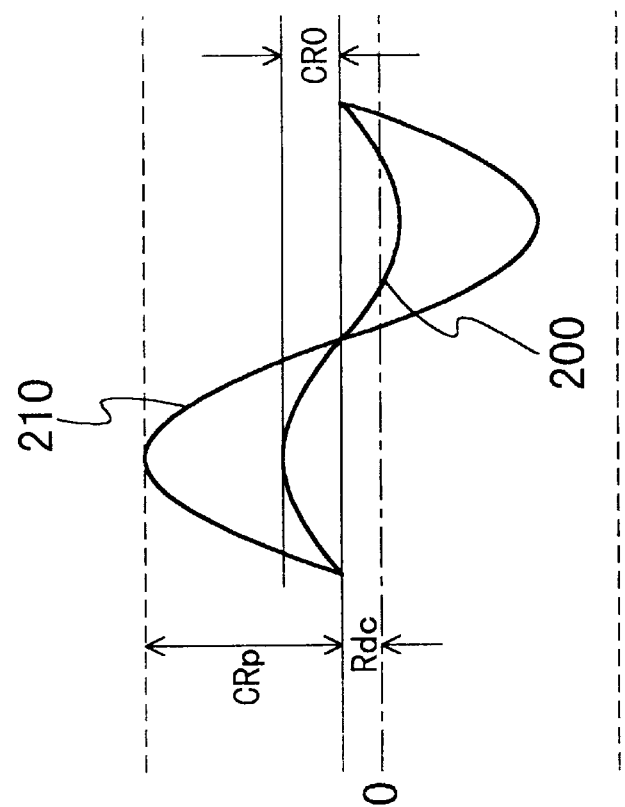
FIGS. 6 and 7 are graphs used for describing the operation of the preferred embodiment.
Figure 6:
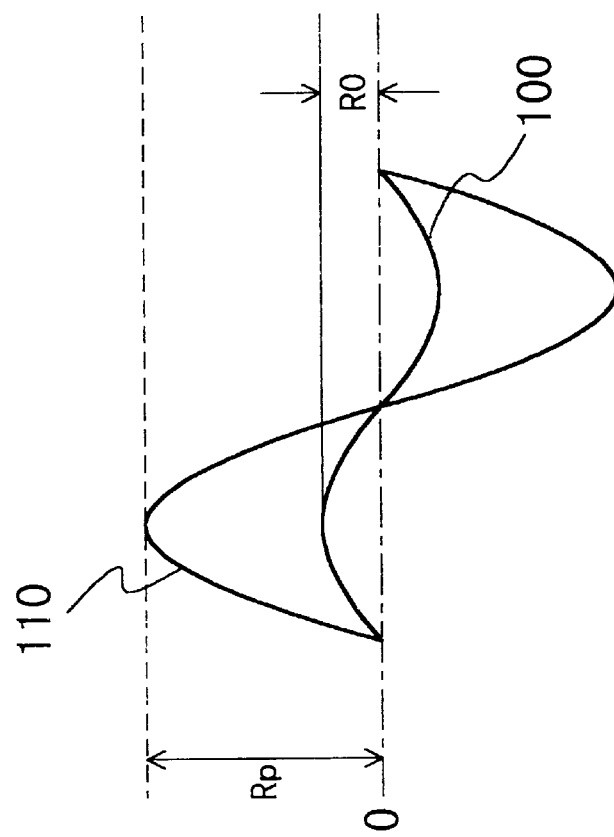

FIGS. 6 and 7 are graphs used for explaining how the reference power generator 60 determines the reference power CLr. FIG. 6 shows waveforms 100 and 110 of the digital received signal r(n) to which no direct-current offset Rdc is added. FIG. 7 shows waveforms 200 and 210 of the digital received signal r(n) to which the direct-current offset Rdc is added. In FIG. 6, the waveform 110 indicates the maximum level of the digital received signal r(n) converted from the analog received signal r(t) affected by Rayleigh-fading. The waveform 100 indicates the level of the digital received signal r(n) converted from the analog received signal r(t) which is not affected by Rayleigh-fading. The amplitudes of the waveforms 100 and 110 are represented by reference symbols RO and Rp, respectively. In theory, the maximum amplitude Rp is not larger than four times the average amplitude RO. Thus, the amplitude RO may be calculated by the following equation (1):

$$RO = Rp/4 \quad (1)$$

In FIG. 7, the waveform 210 indicates the maximum level of the digital received signal r(n) converted from the analog received signal r(t) affected by Rayleigh-fading. The waveform 200 indicates the level of the digital received signal r(n) converted from the analog received signal r(t) which is not affected by Rayleigh-fading. The amplitudes of the waveforms 200 and 210 are represented by reference symbols CRO and CRp, respectively. As can be seen in FIG. 7, when the direct-current offset Rdc is added to the analog received signal r(t), the digital received signal r(n) is controlled to have the maximum amplitude CRp, which is calculated by the following equation (2):

$$CRp = Rp - Rdc \quad (2)$$

The reference power generator 60 determines the reference power CLr favorably so that the amplitude CRO of the digital received signal r(n) meets the following equation (3):

$$CRO = CRp/4 = (Rp - Rdc)/4 \quad (3)$$

This means that the reference power CLr meets the following equation (4):

$$CLr = (CR0/\sqrt{2})^2 \quad (4)$$
$$= (Rp - Rdc)^2/(16 \times 2)$$

Figure 8:
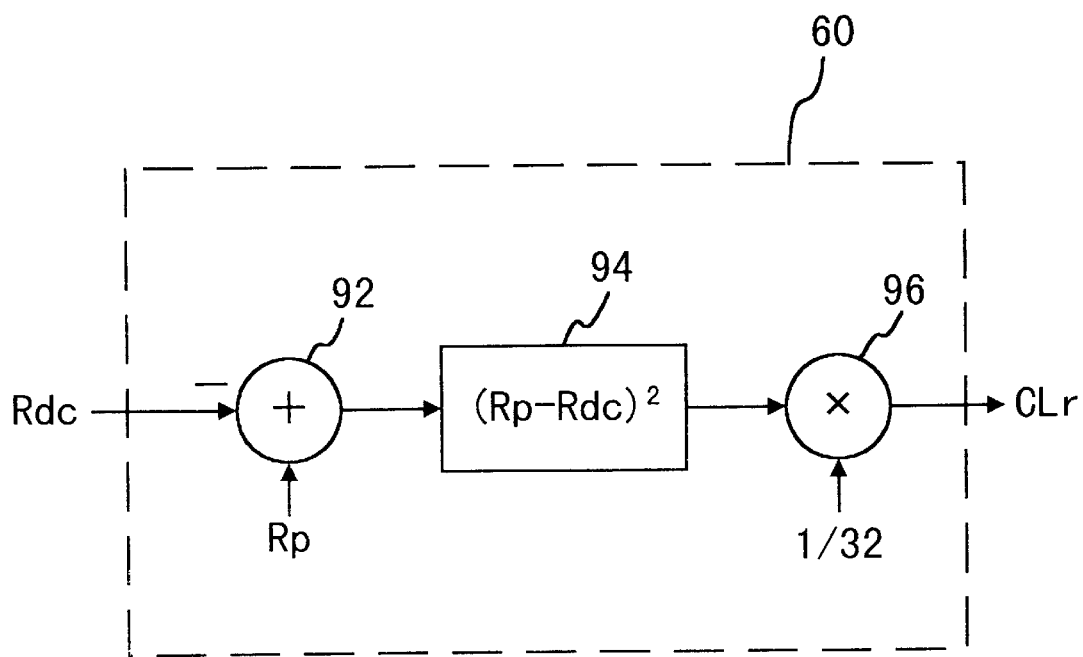
FIG. 8 is an explanatory view showing the circuitry of a reference power generator utilized in the automatic gain control apparatus according to the preferred embodiment of the invention.

FIG. 8 shows the circuitry of the reference power generator 60 which performs the earlier described calculation. The reference power generator 60 includes a subtractor 92, a square circuit 94 and a multiplier 96. The subtractor 92 subtracts the direct-current offset Rdc from the amplitude Rp, which is a calculation corresponding to the equation (2). The square circuit 94 squares the output of the subtractor 92. The multiplier 96 multiplies the output signal of the arithmetic circuit 94 by 1/32, in accordance with the equation (4). In this invention, the reference power CLr can be replaced by the logarithm thereof.

As described above, according to the preferred embodiment of the invention, the automatic gain control apparatus 36 is provided with the DC offset detector 58 and the reference power generator 60 to determine the reference power CLr in consideration of the direct-current offset, so that the reference power CLr has an optimum level for a variety of automatic gain control apparatuses, having different levels of direct-current offsets. Such a favorable reference power CLr makes the gain-controllable amplifier 40 to receive an optimum level of gain control signal Vagc. The A/D converter 42, therefore, can be supplied with the analog received signal r(t) having an optimum amplitude, whose maximum level corresponds to the maximum permissible level of the converter 42. As a result, the A/D converter 42 can operates at an optimum S/N ratio, so that the digital output signal Cr(n) is in a good shape without distortion, which allows the demodulation unit 38 to demodulate the modulated data from the digital signal Cr(n) accurately.

Although the automatic gain control apparatus 36 is applied to digital mobile communication in the early described embodiment, the invention is applicable to other types of radio communication and to a digital receiver for wire communication. In FIG. 1, for easier understanding of the feature of the invention, generally used components in the digital receiver, such as a frequency conversion circuit which converts a signal of a radio frequency into a signal of a base-band frequency; an automatic frequency control circuit; a timing recovery circuit, and so on are omitted.

Although the invention has been described with respect to the specific embodiments for complete and clear disclosure, the appended claims are not be thus limited but are to be construed as embodying all modification and alternative constructions that may occur to one skilled in the art which fairly fall within the basic teaching herein set forth.

What is claimed is:

1. A method for automatic gain control, comprising the steps of:
    controlling the amplitude of an analog input signal at a gain level determined in accordance with a gain control signal to provide an analog received signal;
    converting the analog received signal into a digital received signal;
    detecting a direct-current offset from the digital received signal; and
    generating the gain control signal in consideration of the direct-current offset, wherein the step of generating the gain control signal includes:
        finding the average level of the digital received signal,
        generating, in consideration of the direct-current offset, a reference value which corresponds to a desired average level of the digital received signal,
        finding a difference value between the average level of the digital received signal and the reference value, and
        generating the gain control signal based on the difference value, so that the average level of the digital received signal approximates the reference value.

2. The method according to claim 1, wherein,
    the step of generating the reference value comprises the step of subtracting the direct-current offset from a nominal reference value which is theoretically determined in advance.

3. An automatic gain control apparatus comprising:
    a gain-controllable amplifier which controls the amplitude of an analog input signal at a gain level determined in accordance with a gain control signal to provide an analog received signal;
    an A/D (Analog-to-Digital) converter which converts the analog received signal into a digital received signal;
    a direct-current offset detector which detects a direct-current offset from the digital received signal; and
    a gain control signal generator which generates the gain control signal in consideration of the direct-current offset, the gain control signal generator including:
        (1) an average power calculator which calculates the average level of the digital received signal,
        (2) a reference value generator which generates a reference value in consideration of the direct-current offset, the reference value corresponding to a desired average level of the digital received signal, and
        (3) a subtractor which provides a difference value between the average level of the digital received signal and the reference value,
    wherein the gain control signal is generated based on the difference value, so that the average level of the digital received signal approximates the reference value.

4. The automatic gain control apparatus according to claim 3, wherein,
    the reference value generator subtracts the direct-current offset from a nominal reference value which is theoretically determined in advance.

5. The automatic gain control apparatus according to claim 3, wherein,
    the gain control signal is generated to have an optimum level so that the analog received signal has a maximum amplitude which corresponds to the maximum permissible level of the A/D converter.

6. A digital receiver, comprising:
    an antenna which receives a transmitted RF (Radio Frequency) signal;
    an RF unit which converts the RF signal into an IF (Intermediate Frequency) signal or a base-hand signal to provide an analog input signal;
    an automatic gain control apparatus which controls the level of the analog input signal to provide a digital received signal having an optimum level; and
    a demodulation unit which demodulates modulated data from the digital received signal,
    wherein the automatic gain control apparatus comprises:
        (1) a gain-controllable amplifier which controls the amplitude of the analog input signal at a gain level determined in accordance with a gain control signal to provide an analog received signal,
        (2) a A/D (Analog-to-Digital) converter which converts the analog received signal to provide the digital received signal, (3) a direct-current offset detector which detects a direct-current offset from the digital received signal, and (4) a gain control signal generator which generates the gain control signal in consideration of the direct-current offset, wherein the gain control signal generator comprises:

(1) an average power calculator which calculates the average level of the digital received signal, (2) a reference value generator which generates a reference value in consideration of the direct-current offset, the reference value corresponding to a desired average level of the digital received signal, and (3) a subtractor which provides a difference value between the average level of the digital received signal and the reference value, and wherein the gain control signal is generated based on the difference value, so that the average level of the digital received signal approximates the reference value.

7. The digital receiver according to claim 6, wherein, the reference value generator subtracts the direct-current offset from a nominal reference value which is theoretically determined in advance.

8. A digital receiver, comprising:

an antenna which receives a transmitted RF (Radio Frequency signal;

an RF unit which converts the RF signal into an IF (Intermediate Frequency) signal or a base-band signal to provide an analog input signal;

an automatic gain control apparatus which controls the level of the analog input signal to provide a digital received signal having an optimum level; and a demodulation unit which demodulates modulated data from the digital received signal, wherein the automatic gain control apparatus comprises:

(1) a gain-controllable amplifier which controls the amplitude of the analog input signal at a gain level determined in accordance with a gain control signal to provide an analog received signal, (2) a A/D (Analog-to-Digital) converter which converts the analog received signal to provide the digital received signal, (3) a direct-current offset detector which detects a direct-current offset from the digital received signal, and (4) a gain control signal generator which generates the gain control signal in consideration of the direct-current offset, wherein the gain control signal generator comprises:

(1) an average power calculator which calculates the average level of the digital received signal, (2) a reference value generator which generates a reference value in consideration of the direct-current offset, the reference value corresponding to a desired average level of the digital received signal, and (3) a subtractor which provides a difference value between the average level of the digital received and the reference value, wherein the gain control signal is generated based on the difference value, so that the average level of the digital received signal approximates the reference value, and wherein the gain control signal is generated to have an optimum level so that the amplitude-controlled analog input has a maximum amplitude which corresponds to the maximum permissible level of the A/D converter.

* * * * *